US 6,720,730 B2

(12) United States Patent
Salam

(10) Patent No.: US 6,720,730 B2
(45) Date of Patent: *Apr. 13, 2004

(54) HIGH POWER LED LAMP

(75) Inventor: Hassan P A Salam, London (GB)

(73) Assignee: Unisplay S.A., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/051,187

(22) Filed: Jan. 22, 2002

(65) Prior Publication Data
US 2002/0063521 A1 May 30, 2002

Related U.S. Application Data

(63) Continuation of application No. 09/196,358, filed on Nov. 19, 1998, now Pat. No. 6,346,771.

(30) Foreign Application Priority Data

Nov. 17, 1997 (GB) ............................................. 9724507
Sep. 17, 1998 (GB) ............................................. 9820311

(51) Int. Cl.⁷ ............................................................. H01L 33/00
(52) U.S. Cl. ..................... 313/499; 313/500; 313/512; 257/94; 257/95; 257/99
(58) Field of Search ................................ 313/498–500, 313/512; 257/99, 94, 95, 98

(56) References Cited

U.S. PATENT DOCUMENTS

| 3,443,140 A | 5/1969 | Ing. et al. ..................... 313/108 |
| 3,900,863 A | 8/1975 | Kim .............................. 357/17 |
| 4,214,251 A | 7/1980 | Schairer ........................ 357/17 |
| 4,225,380 A | 9/1980 | Wickens ...................... 156/657 |
| 4,881,237 A | * 11/1989 | Donnelly ...................... 372/50 |
| 5,003,357 A | 3/1991 | Kim et al. ..................... 357/17 |
| 5,087,949 A | 2/1992 | Haitz |
| 5,113,232 A | * 5/1992 | Itoh et al. ...................... 257/91 |
| 5,309,001 A | 5/1994 | Watanabe et al. |
| 5,696,389 A | 12/1997 | Ishikawa et al. ............... 257/99 |
| 5,698,865 A | 12/1997 | Gerner et al. |
| 5,744,828 A | 4/1998 | Nozaki et al. |
| 5,753,940 A | * 5/1998 | Komoto ........................ 257/95 |
| 5,905,275 A | * 5/1999 | Nunoue et al. ................ 257/95 |
| 6,015,719 A | * 1/2000 | Kish et al. ..................... 438/29 |
| 6,111,272 A | 8/2000 | Heinen |
| 6,229,160 B1 | * 5/2001 | Krames et al. ................ 257/94 |
| 6,459,130 B1 | 10/2002 | Arndt et al. |

FOREIGN PATENT DOCUMENTS

| EP | 0442002 | 8/1991 | ........... H01L/33/00 |
| EP | 0559455 | 9/1993 | ........... H01L/33/00 |
| GB | 2311413 | 9/1997 | ........... H01L/33/00 |
| WO | 9712386 | 4/1997 | |

OTHER PUBLICATIONS

English Summary of JP5160437 A, dated Dec. 9, 1991.
English Summary of JP62076686 A, dated Sep. 30, 1985.
English Summary of JP58096781 A, dated Jun. 8, 1983.

* cited by examiner

Primary Examiner—Nimeshkumar D. Patel
Assistant Examiner—Sikha Roy
(74) Attorney, Agent, or Firm—Dykema Gossett PLLC

(57) ABSTRACT

A high-power LED lamp uses an LED chip that can be larger than 1 mm square. The chip has trenches that can convert light trapped in the semiconductor into light that passes through a major surface of the chip. The trenches include light-reflecting tracks joined to a chip terminal and feeding a semiconductor layer. The chip can have triangular light emitting elements that improve light extraction from the semiconductor. The elements can be fused, resulting in improved manufacture yield of chips. A 25 watt single chip lamp with a heat sink very close to the active region is described.

100 Claims, 5 Drawing Sheets

HIGH POWER LED LAMP

CROSS-REFERENCE TO RELATED APPLICATION

This application is a continuation of application Ser. No. 09/196,358, filed Nov. 19, 1998 is now U.S. Pat. No. 6,346,771.

FIELD AND BACKGROUND OF THE INVENTION

The present invention is related to single-chip LED lamps. The purpose of the invention is to provide a single-chip LED lamp that is up to 250 times more powerful than a conventional single-chip LED lamp.

Existing single-chip LED lamps are generally of low input power, typically 40–150 milliwatts. There has been a need for a long time for a single-chip LED lamp of higher power, for example 1 watt or more. The need for a higher power single-chip LED lamp has not been met in spite of the fact that an enormous amount of effort has gone into improvement of LED devices. The amount of effort that has gone into improvement of LED devices is evidenced by the fact that international class H01L 33/00, which is devoted to improvement of LED devices, has thousands of patent publications all differing in disclosure.

Designers of lamps for outdoor use have had the choice mainly of incandescent tungsten light sources, gas discharge light sources, and LED light sources. Designers of LED-based lamps requiring high power have had to resort to using clusters of single chip LED lamps, each of about 0.1 watt rating, wired in series or in parallel and housed together as a single lamp unit to achieve enhanced power. Providing a lamp unit by clustering single-chip LED lamps is very costly, since it involves making several single-chip lamps, housing them in a unit, wiring them up, and testing the final unit. U.S. Pat. No. 5,382,811 and 5,632,551 provide examples of cluster lamps.

Applications for high power LED lamps include outdoor displays, which usually have to operate in direct sunlight and so require powerful lamps, and vehicle lights and traffic lights. At present long-life LED traffic lights for use at street intersections need more than a hundred conventional single-chip LED lamps for each lamp unit. The need to use many LED lamps to provide a single LED traffic light is a disadvantage, particularly since only one tungsten light source is needed for a conventional traffic light.

Prior art single-chip LED lamps having clear convergent lenses, used widely in outdoor displays, suffer not only from the fact that they are of low power but also from the fact that they project light that is not uniform. The non-uniformity is partly due to the bonding pad or pads on the chip top face, which are projected by the lamp as dark areas. The typical width of the bonding pad is about 30–40% of the width of the chip and this is large enough to interfere with achieving good uniformity of projected light even if the LED lens is defocussed relative to top face of the chip. For good quality image displays it is desirable to match the apparent brightnesses of the lamps to within 5%. To achieve this it is important to reduce the nonuniformity caused by the bonding pads.

SUMMARY OF THE INVENTION

An object of the present invention is to provide a single chip LED lamp that avoids or reduces the need for clustering.

A further object of the present invention is to provide a single chip LED lamp arranged so that light emitting portions of the chip are adjusted to be equalised in intensity.

A further object of the present invention is to provide a single chip LED lamp in which the sizes of the bonding pads relative to the size of the chip are reduced, so as to improve uniformity of light projected by a lensed lamp.

A further object of the present invention is to provide a single chip LED lamp, with input power in the region of 5–25 watts, that has low rise of the junction temperature when energised, thus prolonging the life of the lamp and reducing or eliminating the need for forced ventilation of the lamp.

A further object of the present invention is to provide a single chip LED lamp arranged so that light emitting portions of the chip that are faulty by short-circuit are automatically starved of electrical power.

According to an aspect of the invention an LED light source suitable for an LED lamp includes an LED chip having a top face and comprising a substrate and semiconductor layers between the top face and the substrate, the semiconductor layers forming the core of a light guide extending parallel to the plane of the top face. The chip includes at least one cavity with light-emitting side walls that extends into at least one of the semiconductor layers. The chip converts guided light in the core into top light. According to another aspect of the invention guided light in the core is extracted with the aid of reflectors that are parallel to the semiconductor layers. According to yet another aspect of the invention metal tracks connected to the n-type semiconductor layer are provided that enhance the efficiency of the lamp.

According to another aspect of the invention an LED light source includes a chip comprising at least two light emitters each having a triangular top face, the two emitters being separated by a trench.

According to another aspect of the invention a single chip LED lamp which can have input power of 5–25 watts includes an LED chip having a top face and comprising a substrate and semiconductor layers between the top face and the substrate, the semiconductor layers forming the core of a light guide extending parallel to the plane of the top face. The chip includes at least one trench, and a heat sink is attached to the top face of the chip that draws heat from the active region of the chip.

According to another aspect of the invention an LED light source has an LED chip with a plurality of individually powered light emitting elements each provided with a fuse. This improves the yield of usable LED chips during manufacture.

DESCRIPTION OF PREFERRED EMBODIMENTS

In the present invention, "top light" means light that leaves an LED chip by passing through the top face of the chip. The "top face" of the chip means the face of the chip that is furthest away from the substrate of the chip. Cavity tops, side walls and floors are not considered to be part of the top face. "Lens" means a convergent lens. "Guided light" means light propagated by repeated reflections inside a light guide. "High-power LED lamp" means an LED lamp using an LED chip in which the input power rating of the chip exceeds 150 milliwatts.

Figure 1:
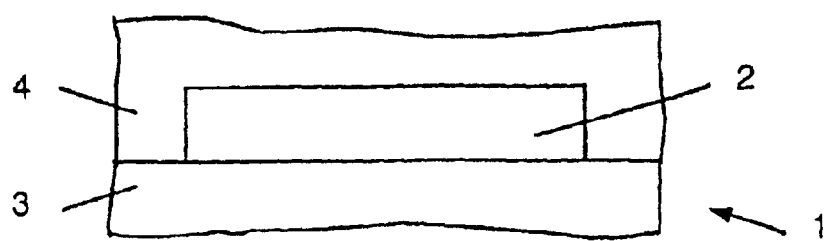
FIG. 1 illustrates in side view an LED light source according to an embodiment of the invention.
Figure 2:
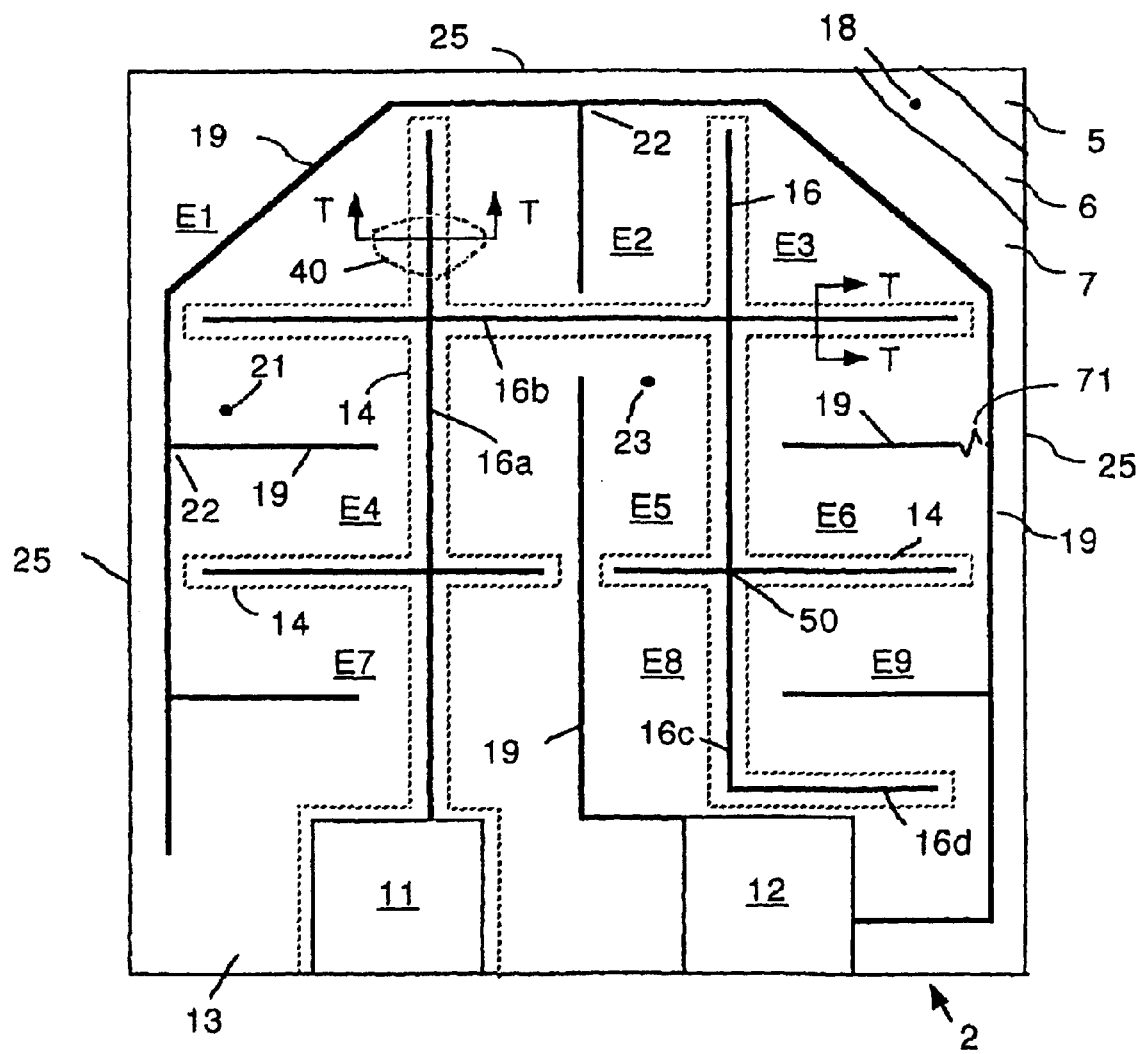
FIG. 2 is a plan view of the LED chip in FIG. 1.
Figure 3:
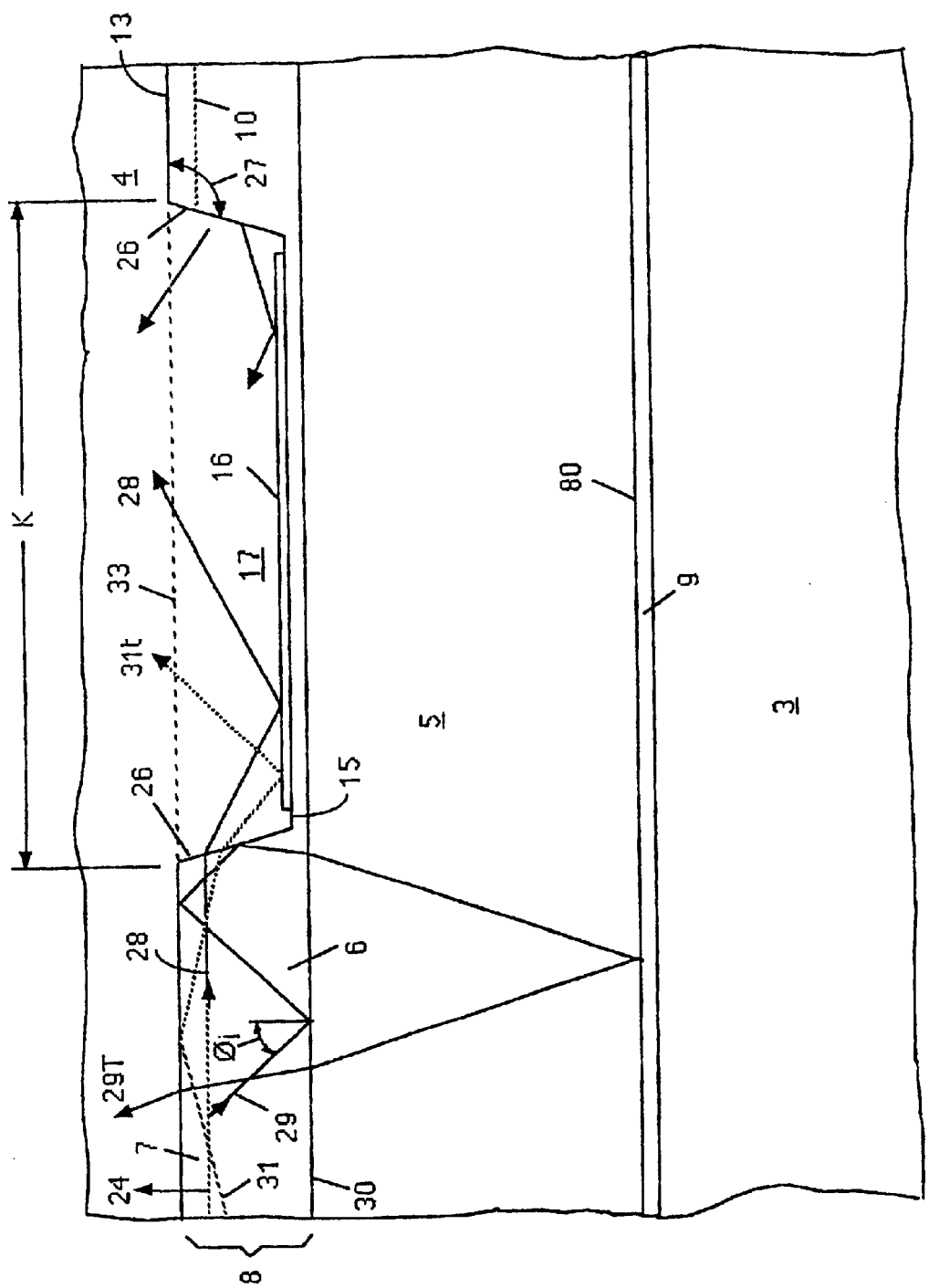
FIG. 3 is a sectional view of a portion of chip 2.

FIGS. 1–3 illustrate an improved LED light source according to an embodiment of the invention. Light source 1 comprises an LED chip 2 mounted on a metal support 3 which may be part of a reflective bowl the floor of which acts as a heat sink. Over chip 2 there is a cover 4 of transparent dielectric material. FIG. 3 is a sectional view taken along T—T of a portion 40 of chip 2.

Chip 2 comprises a transparent base 5 over which is formed a layer 6 of n-type semiconductor material. A layer 7 of p-type semiconductor material is formed over n-layer 6. Each of semiconductor layers 6, 7 can be less than 5 microns thick. Semiconductor layers 6, 7 are referred to collectively as semiconductor 8. Each of the basic n, p layers 6, 7 may include supplementary layers, not shown, that enhance the performance of the chip, or that simplify its manufacture. For example, p-layer 7 may include a thin light-passing gold layer on top of it to, in effect, enhance the electrical conductivity of the p-layer, and the n-layer may include a low resistivety semiconductor layer for enhancing electrical connection within the n-region of chip 2. Active region 10 may include a thin layer of active region material that enhances light generation or that determines the color of the light generated. The whole of the plane of the top of chip 2 up to side faces 25 constitutes a first major surface of chip 2. The lower surface 80 of substrate 5 constitutes a second major surface of chip 2. A reflector 9 is placed on the lower surface 80 of substrate 5. Reflector 9 can be a mirror coating of silver or aluminum.

Transparent cover material 4 has a refractive index $n_c$ that is greater than 1.25, and preferably greater than 1.4. Furthermore, $n_c$ is less than the refractive index $n_s$ of semiconductor 8. The value of $n_c$ is preferably such that $n_s$ is more than 20% higher, and more preferably more than 30%, higher than the value of $n_c$.

Transparent substrate 5 is chosen to be of a material having a refractive index $n_b$ that is at least 15%, and preferably at least 20%, less than the refractive index $n_s$ of semiconductor 8. The arrangement is such that semiconductor 8 together with media 5, 4, acts as a planar light guide, with the light being guided in semiconductor core 8.

Electrically connected to n-layer 6, by contact of its lower surface with n-layer 6, is a bonding pad terminal 11. Electrically connected to p-layer 7, by contact of its lower surface with p-layer 7, is a bonding pad terminal 12. Formed into top face 13 of chip 2, for example by etching, are elongate cavities or trenches 14. The cross-section T—T of trench 14 is illustrated in FIG. 3. Trench 14 has a floor portion 15 that is in the n-layer and that is parallel to chip top face 13. Joined to floor 15, and thereby electrically connected to the buried n-layer 6, is a metallic conductor track 16, comprising gold or other low resistivety metal. For chips generating green or blue light the track 16 preferably comprises metal of good reflectivity to green and blue light, such as aluminum.

Trench 14 is filled with transparent dielectric material 17 having a refractive index $n_t$ that is less than 80% of the refractive index of semiconductor 8. Material 17 is preferably of plastic, such as epoxy. Material 17 may be the same as translucent material 4, or it may be different. All conductors 16 are metallically connected to each other and to bonding pad terminal 11. Thus current from a point 18 in the buried n-layer can reach n-terminal 11 via conductors 16 that are near point 18, instead of only by passing through the whole length of the n-layer between point 18 and terminal 11.

By means of conductors 16, the voltage drop between bonding pad 11 and any point on the n-layer, such as 18, is reduced. This increases the lumens-per-watt efficiency of the chip. Furthermore, the distribution of current and hence the generated light throughout the chip top is made more even.

Conductors 16 comprise meandering tracks. Thus, for example, conductors 16a, 16b together constitute a meandering track, i.e. a track that changes its direction. Conductors 16c, 16d constitute another meandering track. Conductor tracks 16 have node points 50 that join a plurality of tracks together. The width of conductor 16 can be 5–20 μm and its thickness can be 0.5 μm or more. Conductors 16 can be formed by the same process steps as are used for making pad 11, or by similar process steps.

Joined to the top of p-layer 7, and thereby electrically connected to p-layer 7, are electrical conductor tracks 19 shown only in FIG. 2, which may comprise gold or other metal. All conductors 19 are metallically connected to each other and to bonding pad terminal 12. Thus current applied to bonding pad 12 can reach a point 21 in p-layer 7 that is remote from bonding pad 12, mainly via conductors 19, instead of via the p-layer only. Conductor tracks 19 have node points 22 that join a plurality of tracks together. Conductors 19 can be formed by the same process steps as are used for making pad 12, or by similar process steps. The network of conductors 19 comprises meandering tracks.

By means of conductors 19, the voltage drop between bonding pad 12 and any point on the p-layer, such as 21, is reduced This increases the lumens-per-watt efficiency of the chip. Furthermore, the distribution of current and hence the generated light throughout the chip top is made more even.

Conductors 19 may be 1–50 μm wide, or more, and 0.2 to 2 μm thick. Because of their narrow width, dark lines produced by conductors 19 disappear when an image of light source 2 is projected by a defocussed lens. If the p-layer is such that it has a thin light-passing gold layer all over it, then, by incorporating conductors 19 to feed the p-layer, the thickness of the gold layer can be reduced, allowing more light to pass through the gold layer and, therefore, increasing the top light of the chip, while still maintaining low resistance connection to the p-layer.

A ray of light generated within the chip at a point 23 can have any one of many directions. If the direction of the ray is normal or nearly normal to top face 13 of the chip it passes out of the chip as top light 24, if the ray is parallel or nearly parallel to top face 13 of the chip it travels in semiconductor 8, which acts as a light guide core, until it meets a side exit face. In the arrangement of FIGS. 1–3, there are four outer side faces 25 of chip 2 and several supplementary side faces 26 provided by trenches 14. Supplementary side faces 26 allow light progressing sideways in semiconductor layers 6, 7 to escape from the chip without having to travel all the way to outer side faces 25. Because the sideways light trapped between media 4, 5 travels a shorter distance within semiconductor 8 before it escapes, it is attenuated less. This lower light attenuation facilitates making large, bright LED chips. Conductors 16, 19 result in lower electrical losses and so, also, facilitate making large, bright LED chips.

Light emanating from chip 2 is illustrated by various rays shown in FIG. 3. Each trench wall 26 forms an obtuse angle 27 with the part of top face 13 that adjoins the side wall and emits light. Obtuse angle 27 is preferably between 95 and 130 degrees, and more preferably between 110 and 120 degrees. Wall 26 may have a curved cross section. In this case angle 27 is measured between the plane tangential to the wall half way up the height of the wall and top face 13.

The depth of trench 14 is preferably more than 50% of the thickness of semiconductor 8, so as to allow a large proportion of the light in semiconductor 8 approaching the trench to escape through trench wall 26. The thickness of the layer of n-type material under metal track 16 is preferably greater than 5% of the total thickness of the n-layer, so as to maintain good electrical connection between track 16 and the body of n-type semiconductor material either side of trench 14.

The paths of rays 28, 29 generated at the semiconductor active region 10 are illustrated in FIG. 3. Because the index of refraction $n_s$ of semiconductor 8 is higher than the index of refraction $n_t$ of cover material 4 and trench wall 26 forms an obtuse angle with chip top face 13, horizontal ray 28 hitting trench wall 26 is diverted downwards by refraction as it passes through wall 26. Ray 28 is then reflected upwards by reflector 16 to pass through aperture 33 of the trench, it is not only horizontal rays that will pass through trench wall 26. Rays that have been guided by multiple internal reflection in semiconductor 8 that hit wall 26 with a small angle of incidence will also pass through the wall, such as ray 31.

Ray 29 hitting interface 30 between semiconductor 8 and base 5 at an an angle of incidence $\phi_i$ of 45 degrees is totally reflected at interface 30, as shown, and then again at interface 13. Ray 29 is propagated sideways by the previously mentioned light-guide property of layers 4, 8, 5. Total reflection of ray 29 at interface 30 occurs because the angle of incidence $\phi_i$ is greater than the critical angle $\phi_{csb}$ for total internal reflection at interface 30. The reflected ray 29 hits top surface 13 at 45 degrees, and it is again totally reflected, because the angle of incidence of ray 29 to top surface 13 is greater than the critical angle $\phi_{csc}$ for the interface between semiconductor 8 and cover material 4. Ray 29 then hits trench wall 26. At trench wall 26 ray 29 is yet again totally reflected. Total reflection of ray 29 occurs at surface 26 because its angle of incidence is greater than the critical angle $\phi_{cst}$ for the interface between semiconductor 8 and trench material 17. After being diverted by reflection by trench wall 26, ray 29 exits semiconductor 8 through interface 30. Ray 29 exits semiconductor 8 because it hits interface 30 at an angle of incidence that is less than the critical angle $\phi_{csb}$ for interface 30. Ray 29 is then reflected by reflector 9 upwards to exit through chip top face 13 as top light ray 29T.

Taking the case, for example, where:
Cover medium 4 and trench material 17 are both of epoxy having a refractive index of 1.5, i.e. $n_c=n_t=1.5$;

Base 5 is sapphire having a refractive index of about 1.7, i.e. $n_b=1.7$;
Semiconductor 8 has a refractive index $n_s=3$
Obtuse angle 27 has a value $\phi_{27}=100°$
Then:

$\phi_{csc}=\sin^{-1}n_c/n_s=\sin^{-1}0.5=30°$ $\phi_{cst}=\sin^{-1}n_t/n_s=\sin^{-1}0.5=30°$ $\phi_{csb}=\sin^{-1}n_b/n_s=\sin^{-1}1.7/3=\sin^{-1}0.567=34.5°$.

After it is diverted by face 26, the angle of incidence of ray 29 to interface 30 is equal to: $45°-2(\phi_{27}-90°)=25°$, which is less than $\phi_{csb}$. If $\phi_{27}$ is increased to 110° the angle of incidence of ray 29 to interface 30 reduces to 5°.

If the layers of semiconductor 8 have unequal refractive indexes, the value of $n_s$ is taken to be equal to the highest of these unequal refractive indexes. Substrate 5 may comprise a transparent support covered with a thin layer, next to core 8, having the refractive index $n_b$. In this case the transparent support may be of material, such as semiconductor, having a higher refractive index higher than $n_b$. For the thin layer to provide good reflection to guided light the thickness of the thin layer should be greater than the wavelength of the light generated, and preferably greater than twice the wavelength of the light generated.

Until it hits side wall 26, ray 29 is guided light travelling in the core of a light guide. The guided light 29 becomes converted into top light 29T. Light 29T is light that has passed through the p-layer 7 and top face 13. The top surface of metal support 3 can be relied on for reflecting light at the bottom of substrate 5 if there is no reflective coating 9 on substrate 5.

The arrangement of FIG. 2 can be regarded as consisting of nine elemental areas E1–E9 each emitting top light, each having at least one corner next to two trenches 14, and each covered with at least one top conductor 19. There is a trench 14 running between each adjacent pair of areas E. Top light 24 from top face 13 of each adjacent pair of elements E is accompanied with trench light emanating from the trench between the pair. The chip can be large, for example up to 1000 μm or more wide, and it may have more than nine elements E. Pads 11, 12 can each be about 150 μm square or less. The width of each element E is arranged to be several times greater than width K of trench 14. For example, the width of element E5 may be 300 μm and K may be 15 μm. Trench width K is preferably several times greater than the wavelength of the light from the active region, and is preferably more than twice the depth of trench 14. Conductor 16 between a pair of elements E provides a low resistance connection between the pair.

Figure 4:
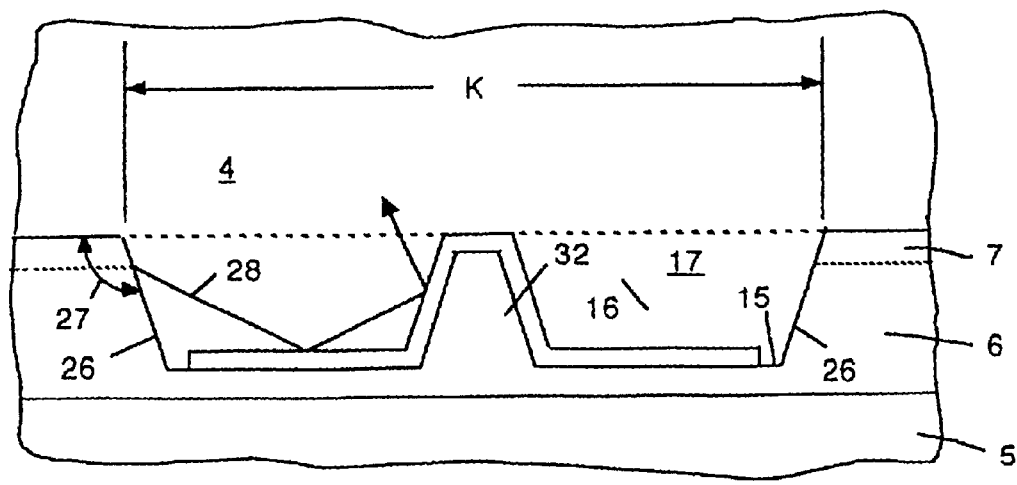
FIG. 4 is a cross-sectional view of a trench having a central ridge.

Transparent dielectric material 17 filling the trench may have a refractive index $n_t$ between 1.25 and 2.5. The value of $n_t$ affects transmission of light through wall 26. The higher the value of $n_t$ the larger the critical angle $\phi_{cst}$ at the inner face of trench wall 26 will be. With a larger critical angle more light can pass through trench wall 26. Trench 14 may have a central ridge 32, illustrated in FIG. 4, which extends along its length. Track 16 covers ridge 32. Ray 28 is shown doubly reflected by ridged track 16.

Figure 5:
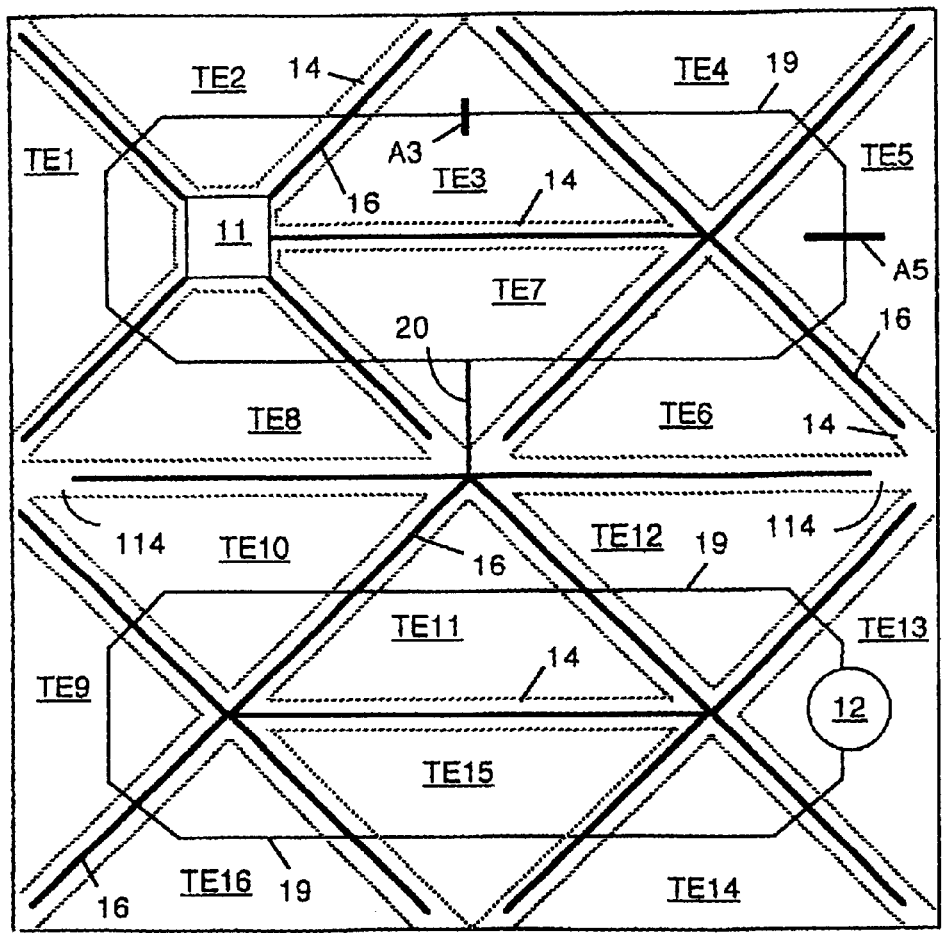
FIG. 5 illustrates a light source according to a further embodiment of the invention.

FIG. 5 illustrates a further embodiment of the invention. The arrangement differs from that of FIG. 2 in that it uses triangular light emitting elements instead of rectangular ones, and in that it includes two sets of light emitting elements connected in series. Chip 36 has 16 triangular light emitting elements, TE1–TE16. Elements TE1–TE8 are connected in parallel with each other. Also, elements TE9–TE16 are connected in parallel with each other. There is insulation, not shown, under conductors 19 at the areas where they cross over trenches 14, and there is insulation, not shown, under the whole of conductor 20. The n-layer for elements T1–T8 is isolated from the n-layer of elements TE9–TE16. The isolation can be achieved by making trenches 114, between set TE1–TE8 and set TE9–TE16, sufficiently deep so that their floors 15 are in substrate 5, instead of in n-layer 6. Trenches 114 may include conductors 16, as shown, or not.

Current applied to p-terminal 12 is fed to the p-layers of elements T9–T16 by means of conductors 19, and the current from conductors 16 of elements TE9–TE16 passes through conductor 20 to conductors 19 in contact with the p-layers of elements T1–T8. The current from conductors 16 of elements TE1–TE8 passes into n-terminal 11. Thus chip 36 comprises a first set of light generating elements (TE9–TE16 connected in parallel) connected in series with a second set of light generating elements (TE1–TE8 connected in parallel). Light extraction from the trenches can be as described before in relation to FIGS. 3, 4.

Figure 6A:
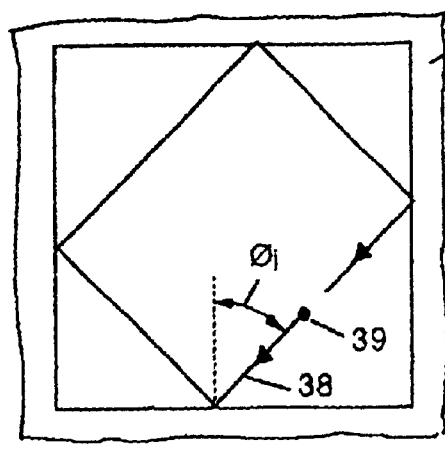
FIG. 6a illustrates light paths for an LED element having a rectangular top light-emitting surface.
Figure 6B:
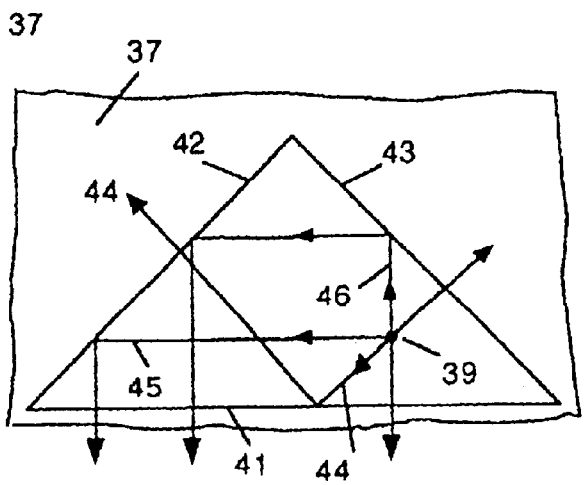
FIG. 6b illustrates light paths for an LED element having a triangular top light-emitting surface.

The use of triangular elements instead of rectangular ones enhances light extraction further. This is explained as follows. FIG. 6a illustrates in plan view an LED element embedded in epoxy 37 and having a conventional (rectangular) top light-emitting surface. Epoxy 37 is taken to have a refractive index that is half that of the semiconductor of the element, resulting in the critical angle being 30 degrees. A ray 38 that starts at a point 39 and and that is parallel to top face of the element is shown hitting a side wall of the element at an incident angle $\phi_i=45°$. Ray 38 is subjected to successive total internal reflection and cannot escape from the element, as illustrated. By comparison with FIG. 6a, FIG. 6b shows in plan view an LED element embedded in epoxy 37 and having a triangular top, such as the ones in chip 36. The element has side walls 41, 42, 43. Side wall 41 is inclined to sidewall 42 by an acute angle of 45 degrees. Also, side wall 43 is inclined to sidewall 41 by an acute angle of 45 degrees. A ray 44 starting at point 39 can escape even if though it hits side wall 41 at 45 degrees, because after internal reflection it hits side wall 42 with an incident angle of zero. Rays 45, 46 also hit side walls at 45 degrees and subsequently escape. Thus the element with the triangular top is more efficient for light extraction from the semiconductor than the element with a rectangular top.

In the arrangement of FIG. 5, each of the elements TE may be provided with an individually chosen adjuster A. Only two of the adjusters, A3, A5, are shown. Each adjuster A is in contact with the p-layer under it. The areas of the adjusters are chosen so that each element TE has the same illumination as the other elements TE regardless of its position on the chip. Thus, for example, adjuster A5 is larger than adjuster A3. Thus the series resistance between track 19 and the p-layer is less for element TE5 than it is for TE3. By appropriate choice of the different adjuster sizes, all elements TE can produce the same light even if the voltages applied to then are not exactly the same, and even though some of the elements have only two associated trench conductors 16 instead of three. As an alternative to adjustment by elements A, the width of track 19 can be varied from element to element to achieve the matching. Matching by differing elements A or by variation of the widths of conductors 19 can also be provided for the elements E in the arrangement of FIG. 2. Uniformity of chip lighting of better than ±3% is desirable for lensed lamps used in video displays, so as to provide uniformity of the light projected by each lamp lens.

Manufacture of a light source unit based on the chip of FIG. 2 or FIG. 5, starting with a substrate wafer common to a plurality of final light source units, includes the steps, in order, of: applying a reflective layer, for reflector 9, to the bottom surface of the base wafer; forming the semiconductor layers over the top of the wafer; forming trenches 14 (and 114 in the case of FIG. 5) into the semiconductor by chemical etching or by other means; forming tracks 16 in the trenches; insulating trenches 14 at least at the parts thereof where tracks 19 will cross over, and providing insulation for conductor 20 in the case of FIG. 5; forming tracks 19; dicing the wafer to provide separate chips; and filling the trenches and covering the top and outer sides of each chip with transparent dielectric material having a refractive index of more than 1.25.

Figure 7A:
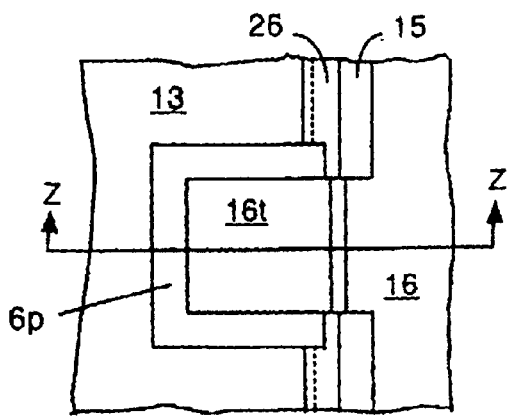
FIGS. 7a, 7b illustrate connection of a reflector track to a lower semiconductor layer.
Figure 7B:
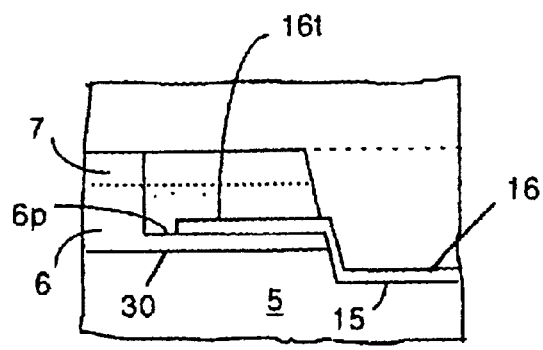

In the various arrangements discussed herein trenches 14 can extend into base 5 so that interface 30 is above the top of the portion of track 16 that is in contact with floor 15 of the trench. In this case, track 16 can have contact tabs 16t on both of its sides that are connected to the two n-layer zones separated by the trench. FIGS. 7a, 7b illustrate a contact tab which emanates from track 16 to make electrical contact with a small plateau 6p in n-layer 6. Each of the elements E or TE can have several contact tabs 16t electrically connected to the element.

In the various arrangements discussed herein reflector 16 can be extended in width so that it covers part or all of each of its side walls 26. In this case the trench is arranged to have translucent dielectric material over at least a portion of each side wall 26 to prevent short circuiting the p-layer to the n-layer. Furthermore, in the various arrangements discussed herein trench 14 may have a side-wall profile that includes one or more steps.

Figure 8:
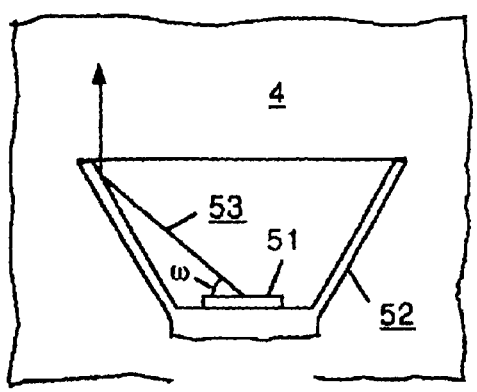
FIG. 8 illustrates a reflector cup for the chips of FIGS. 2, 5.

FIG. 8 illustrates another embodiment of the invention. Chip 51, of the type of FIG. 2 or FIG. 5, mounted in a metallic reflective cup 52 and embedded in epoxy 4. The top of epoxy 4 (not shown) is formed as a lens. Cup 52 is made deep so that a ray 53 emanating from the central area of the top face of chip 51 at an angle w relative to the chip top face is deflected by the cup. Angle w is greater than 30 degrees, and preferably greater than 40 or 45 degrees.

Figure 9:
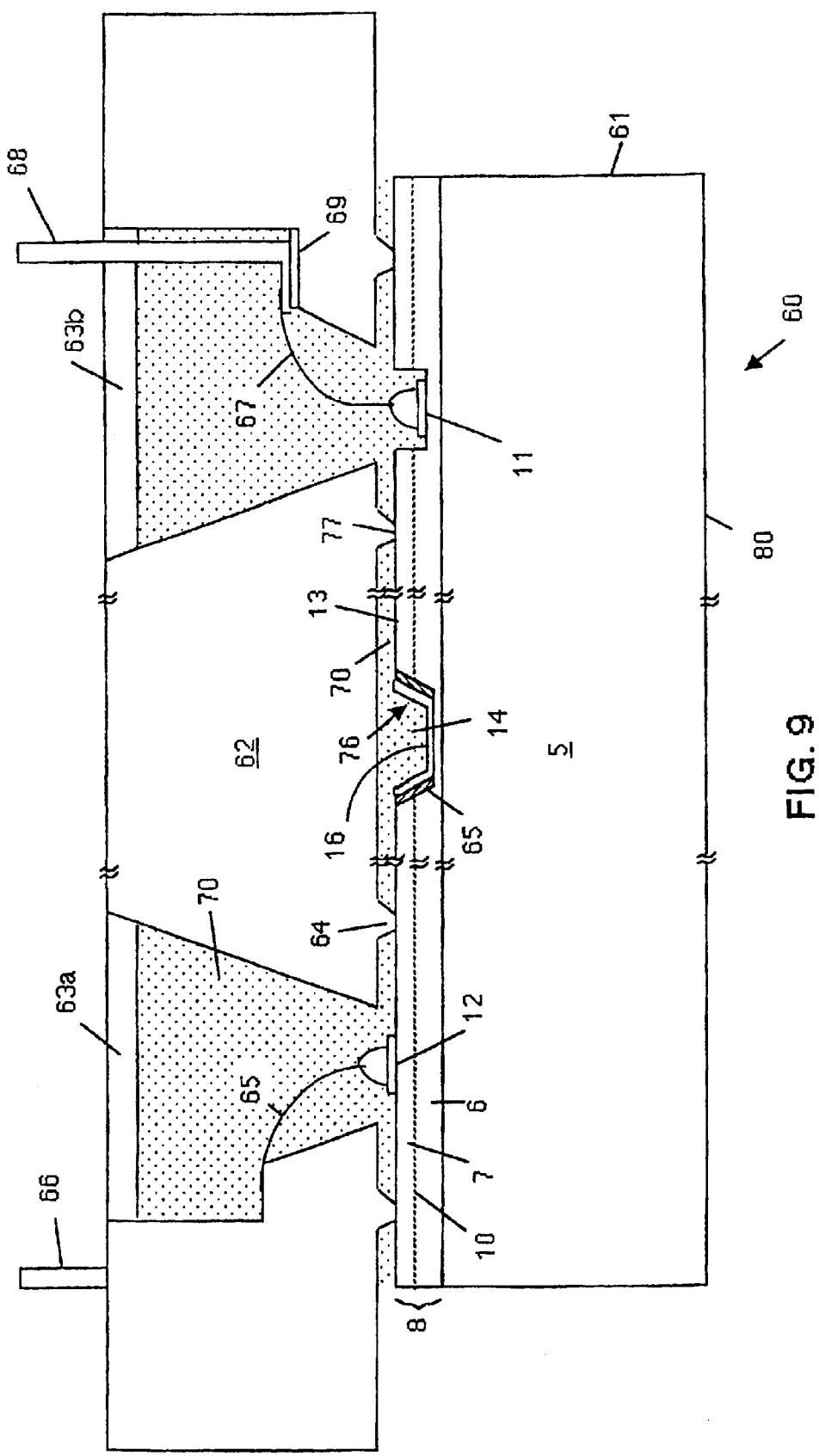
FIG. 9 illustrates an embodiment of the invention having a heat sink on the chip top face.

FIG. 9 illustrates schematically a further embodiment of the invention. Light source 60 comprises a chip 61 which is preferably of the same or similar construction as that previously discussed for FIG. 2 or FIG. 5, but with no reflector 9 on substrate 5. Chip 61 may be as large as 5 mm wide and have many elements and have an input power of 5–25 watts. For the arrangement of FIG. 9, track 16 is preferably either of small width (preferably less than 0,5 K), or of large width, about equal to K, as shown in FIG. 9. A transparent insulator 65 covers each of the two semiconductor side walls. Track 16 covers each of insulators 65. Thus the whole of the side wall 76 includes a metallic reflector insulated from p-layer 7 and active region 10. The two side walls 76 each form an obtuse angle with top face 13. A heat sink 62 of aluminum, which has a high thermal conductivity and high optical reflectivity, is placed over chip 61. Heat sink 62 has integral spacer portions 64 drawing heat away from chip top face 13. Heat sink 62 can be 5 mm thick, or more, and is thermally connected to a larger heat sink, not shown, that cools heat sink 62. Chip p-terminal 12 is connected by bonding wire 65 to aluminum heat sink 62 and hence to the p-terminal 66 of the lamp. Chip n-terminal 11 is connected by bonding wire 67 to lamp n-terminal 68 which is supported on insulator 69. Openings 63a, 63b in heat sink 62 allow access to the chip terminals to achieve bonded wiring 65, 67. After bonding of wires 65, 67 epoxy is injected into openings 63a, 63b to protect wires 65, 67 and to cover top face 13 with epoxy. Covering top face 13 with epoxy provides perfect reflection for guided light and enhances extraction of top light from chip 61. After leaving the chip the top light is reflected by the under surface of heat sink 62 to pass back into the chip and out of substrate 5. Faces 77 of spacers 64 can be small, so that most of top face 13 is covered with epoxy, and hence most of the reflections of guided light by interface 13 are 100% total internal reflections. For the internal reflections occurring at faces 77, a proportion of the light energy is lost at each reflection, spacers 64 can be numerous, so that they provide adequate cooling of the semiconductor junction 10. Thermal connection between spacers 64 and chip top face 13 can be enhanced by coating the lower faces of spacers 64 with a suitable heat transfer compound before pressing heat sink 62 onto chip 61. Epoxy 70 may be laid on top face 13, for example by pad printing, prior to pressing heat sink 62 onto the chip and as a separate operation from filling cavities 63a, 63b. Any translucent material having a refractive index greater than 1.25 may be used instead of epoxy for medium 70. The thickness of medium 70 under heat sink 62 is preferably greater than the wavelength of the light of the chip. The thickness can be several times the wavelength.

A 25 watt chip can have 256 light emitting elements E or TE. It is not essential to have perfect yield of the light emitting elements. If production quality is such that a few of the elements do not emit light, the lamp will still function to give powerful light.

Referring to FIG. 2, each of elements E2, E4, E5, E6. E7, E9 has an individual p-conductor 19 energising the element. It is possible by modification of the wiring to arrange that all the elements E have individual p-conductors. In this case each individual p-conductor may have a fuse, such as fuse 71 illustrated for element E6, arranged to burn out when the current to the element exceeds the intended current for the element by a factor of, for example, 2.5. By this means, short-circuited elements in the chip are automatically isolated when the power is applied to the chip. The triangulated chip of FIG. 5 also may have its wiring re-arranged to provide individual fusing of each of the elements TE.

A lamp of 256 elements can be wired as 36 blocks in series, each block having 16 elements TE connected in parallel, with each element TE having its own fuse, with this arrangement failure of an element TE, during manufacture or during service, does not put another element TE out of action. If, for example, in each bock four random elements TE are open circuit, the lamp will still function. With the yield of good elements TE at only 75% the lamp gives about 75% of the light of a lamp having no faulty elements TE.

Figure 10:
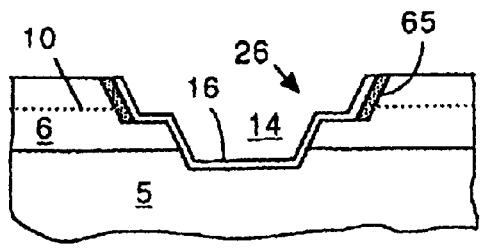
FIG. 10 illustrates an alternative form of trench.

FIG. 10 shows another arrangement for trench 14 that can be used in any of the chips described herein. As shown, trench 14 cuts into substrate 5, and includes translucent dielectric 65 over the p-layer portion of stepped side wall 26. Track 16 makes electrical contact with n-layer 6 at side wall 26.

In the various arrangements that have been discussed herein, layers 6, 7 and the active region 10 may each comprise nitride of two or more of gallium, indium and aluminium, or nitride of just one of these elements, and the substrate can be sapphire.

The various teachings herein can be applied to lamps employing a chip having a plurality of different colored active regions stacked one over the other ox side by side.

Any of the light source arrangements described herein can be used in a lensed lamp having a convergent lens of a diameter greater than the diagonal of the chip.

Reflectors such as 16, 80, 62 are referred to herein as "opaque reflectors". They are reflective to light of all angles of incidence, unlike interface 30 which is transparent to light of low angles of incidence. A thin metallic film used as a reflector is regarded as an opaque reflector even if it passes some light.

What is claimed is:

1. An LED lamp for generating incoherent visible light, comprising:
    an inorganic semiconductor structure comprising a lower semiconductor layer having a lower face thereof and an upper semiconductor layer having an upper face thereof, said lower and upper semiconductor layers forming a diode and an active region between said layers generating light, said structure having outer side faces (25) surrounding the structure and a plane generally parallel to said lower face defining a reference plane;
    means harvesting vertical light from said active region;
    at least one metal conductor on said semiconductor structure electrically connected with said upper semiconductor layer;
    a plurality of cavities in said semiconductor structure, each cavity extending from said upper face into said semiconductor structure and each containing a metal part that is in electrical contact with said lower semiconductor layer and that is distant from said outer side faces; said semiconductor structure being arranged to have several light-extraction surfaces for enhancing release of light from the semiconductor structure, said light-extraction surfaces being distant from said outer side faces and inclined to said reference plane, LED light propagating in the semiconductor structure being diverted at said light-extraction surfaces; and
    electrical interconnection for causing the metal parts in said cavities to pass current together when the lamp is turned on.

2. An LED lamp according to claim 1 wherein side walls of said cavities provide at least some of said light-extraction surfaces.

3. An LED lamp according to claim 1 wherein said light-extraction surfaces are side walls of trenches.

4. An LED ramp according to claim 1 including a conductor layer in electrical contact with said upper semiconductor layer, the conductor layer reducing voltage drops in the upper semiconductor layer.

5. An LED lamp according to claim 4 wherein said conductor layer is of metal.

6. An LED lamp according to claim 1 including a substrate that is light-passing to visible light and over which at least one of said semiconductor layers has been grown.

7. An LED lamp according to claim 5 wherein said conductor layer is light-passing by being thin.

8. An LED lamp according to claim 1 wherein said metal parts serve as reflectors for light generated by said active region.

9. An LED lamp according to claim 1 wherein said light extraction surfaces are oblique to said reference plane.

10. An LED lamp according to claim 1 wherein there are islands of said upper face defined by said light-extraction surfaces.

11. An LED lamp according to claim 1 including amorphous material at said light-extraction surfaces.

12. An LED lamp according to claim 1 wherein there are cavities that cut through said semiconductor structure.

13. An LED lamp according to claim 1 wherein each of said light-extraction surfaces meets an associated portion of said upper face at an angle measured through semiconductor of at least 90 degrees.

14. An LED lamp according to claim 1 including meandering conductors on said semiconductor structure.

15. An LED lamp according to claim 1 including a heat sink less than 50 microns away from said active region.

16. An LED lamp for generating incoherent visible light, comprising:

an inorganic semiconductor structure comprising a lower semiconductor layer and an upper semiconductor layer, said lower and upper semiconductor layers forming a diode and an active region between said layers generating light, said structure having outer side faces surrounding the structure;

LED portions within said semiconductor structure, each LED portion provided with an associated conductor for energizing the portion and an associated electrical link (71) in series with the associated conductor, some of said LED portions being faulty and having their associated links deliberately disrupted;

electrical connections for energizing several of said LED portions together; and wherein said semiconductor structure has light-extraction surfaces arranged for harvesting light from said semiconductor structure, said light-extraction surfaces being distributed distant from said outer side faces and being inclined to said active region, light generated in the semiconductor structure being diverted at said light-extraction surfaces.

17. An LED lamp according to claim 16 wherein said disrupted links are disrupted fuses.

18. An LED lamp according to claim 16 wherein said disrupted links are on said semiconductor structure.

19. An LED lamp for generating incoherent visible light, comprising:

an inorganic semiconductor structure comprising: a lower semiconductor layer having a lower face thereof; an upper semiconductor layer grown over said lower semiconductor layer and having an upper face thereof, said lower and upper semiconductor layers forming a diode; and an active region between said layers generating light a substantial proportion of which propagates parallel to said active region guided by internal reflections at said upper and lower faces, said structure having outer side faces surrounding the structure;

a conductor layer in electrical contact with substantially all of the top of said upper semiconductor layer;

means harvesting vertical light from said active region;

a plurality of spaced-apart conductor parts distributed about the semiconductor structure, each of said conductor parts being in electrical contact with said lower semiconductor layer and positioned between light generating portions of said semiconductor structure as viewed normal to said layers;

electrical connection for causing said conductor parts to pass current to said lower semiconductor layer together when the lamp is turned on; and wherein said semiconductor structure is arranged to have several light-extraction surfaces for release of light that is generated under said conductor layer and guided by said reflections, said light-extraction surfaces being distant from said outer side faces, inclined to said active region, and each meeting at least one of said lower and upper faces.

20. An LED lamp according to claim 19 wherein at least one of said conductor parts comprises a conductor finger.

21. An LED lamp according to claim 19 including amorphous translucent material at said light-extraction surfaces.

22. An LED lamp according to claim 19 wherein said upper face is within 10 microns of said lower face.

23. An LED lamp for generating incoherent visible light, comprising:

an inorganic semiconductor structure comprising: a lower semiconductor layer having a lower face thereof; an upper semiconductor layer grown over said lower semiconductor layer and having an upper face thereof, said lower and upper semiconductor layers forming a diode; and an active region between said layers generating light a substantial proportion of which propagates parallel to said active region guided by internal reflections at said upper and lower faces, said structure having outer side faces surrounding the structure;

a layer of material translucent to visible light and of lower refractive index than said lower semiconductor layer below the lower semiconductor layer, the translucent layer acting as a reflector for said guided light;

a semiconductor substrate of higher refractive index than said layer of translucent material below the layer of translucent material, the substrate passing vertical light from said active region;

a conductor layer covering and in electrical contact with said upper semiconductor layer;

a plurality of spaced-apart opaque conductors on said semiconductor structure for energizing one of said upper and lower semiconductor layers, at least one of the opaque conductors appearing between light-generating portions of said semiconductor structure as viewed normal to said reference plane;

electrical connection causing said opaque conductors to pass current to said semiconductor structure together when the lamp is turned on; and wherein vertical light from said active region passes between a pair of said opaque conductors and wherein said semiconductor structure is arranged to have several light extraction surfaces for release of said guided light from the semiconductor structure, said light-extraction surfaces being distant from said outer side faces and inclined to said reference plane for diverting said guided light for output from the semiconductor structure.

24. An LED lamp according to claim 23 wherein said conductor layer is light-passing.

25. An LED lamp according to claim 23 including amorphous material at said light-extraction surfaces.

26. An LED lamp according to claim 23 wherein said light extraction surfaces are side walls of cavities that extend into said lower semiconductor layer.

27. An LED lamp for generating incoherent visible light, comprising:

an inorganic semiconductor structure comprising a lower semiconductor layer and an upper semiconductor layer, said lower and upper semiconductor layers forming a diode and an active region between said layers generating light, said structure having outer side faces surrounding the structure;

LED portions within said semiconductor structure each having an anode and a cathode, the cathode of one of of the portions being metallically connected to the anode of another of the LED portions;

electrical connections for energizing several of said LED portions together; and wherein said semiconductor structure has light-extraction surfaces arranged for harvesting light from said semiconductor structure, said light-extraction surfaces being distributed distant from said outer side faces and being inclined to said active region, light generated in the semiconductor structure being diverted at said light-extraction surfaces.

28. An LED lamp according to claim 27 including a first set of said LED portions electrically connected in parallel; a second set of said LED portions electrically connected in parallel; and electrical connection for driving said sets in series.

29. An LED lamp for generating incoherent visible light, comprising:

an inorganic semiconductor structure comprising: a lower semiconductor layer having a lower face thereof; an upper semiconductor layer having an upper face thereof, said lower and upper semiconductor layers forming a diode; and an active region between said layers generating light, a plane generally parallel to said lower face defining a reference plane; means harvesting vertical light from said active region;

a plurality of opaque conductor parts in electrical contact with said upper semiconductor layer;

a plurality of grooves provided in said semiconductor structure for light-extraction, each having a light-emitting side wall that meets said upper face and that is inclined to the upper face by an obtuse angle measures through semiconductor; each of the grooves containing a metallic reflector arranged for redirecting light emanating from the light emitting side wall; and electrical connection for causing currents to be fed to said upper semiconductor layer via said opaque conductor parts when the lamp is turned on.

30. An LED lamp according to claim 29 including a reflector below said lower face receiving light reflected by one or more of said light-emitting side walls.

31. An LED lamp for generating incoherent visible light, comprising:

an inorganic semiconductor structure comprising: a lower semiconductor layer having a lower face thereof; an upper semiconductor layer having an upper face thereof, said lower and upper semiconductor layers forming a diode; and an active region between said layers generating light, a plane generally parallel to said lower face defining a reference plane; means harvesting vertical light from said active region;

a plurality of opaque conductor parts in electrical contact with said upper semiconductor layer and between which light passes;

a plurality of grooves provided in said semiconductor structure for light-extraction, each of the grooves having a light emitting side wall and containing an associated metallic reflector that reflects some rays from the light emitting wall at least twice successively; and electrical connection for causing currents to be fed to said upper semiconductor layer via said opaque conductor parts when the lamp is turned on.

32. An LED lamp for generating incoherent visible light, comprising:

an inorganic semiconductor structure comprising: a lower semiconductor layer having a lower face thereof; an upper semiconductor layer having an upper face thereof, said lower and upper semiconductor layers forming a diode; and an active region between said layers generating light; means harvesting vertical light from said active region;

a plurality of opaque conductor parts in electrical contact with said upper semiconductor layer and between which light passes;

a plurality of light-extraction grooves excavated in said semiconductor structure each having a side wall that emits light and each containing a metallic reflector for deflecting the emitted light; and electrical connection for causing currents to be fed to said upper semiconductor layer via said opaque conductor parts when the lamp is turned on.

33. An LED lamp according to claim 32 including a light passing conductor layer in electrical contact with said upper face.

34. An LED lamp according to claim 32 including a light passing substrate under said semiconductor structure and a reflector under said substrate redirecting downward light generated by said active region.

35. An LED lamp for generating incoherent visible light, comprising:

an inorganic semiconductor structure comprising: a lower semiconductor layer having a lower face thereof; an upper semiconductor layer having an upper face thereof, said lower and upper semiconductor layers forming a diode; and an active region between said layers generating light;

means harvesting vertical light from said active region; a plurality of opaque conductor parts in electrical contact with said upper semiconductor layer and between which light from said active region passes;

a plurality of light-extracting trenches in said semiconductor structure, at least one of the trenches being inclined to another of the trenches by an acute angle; and electrical connection for causing currents to be fed to said upper semiconductor layer via said opaque conductor parts when the lamp is turned on.

36. An LED lamp according to claim 35 wherein said trenches form triangular areas in said upper face.

37. An LED lamp according to claim 35 including a light passing conductor layer in electrical contact with said upper face.

38. An LED lamp for generating incoherent visible light, comprising:

an inorganic semiconductor structure comprising: a lower semiconductor layer having a substantially flat lower face thereof; an upper semiconductor layer grown over said lower semiconductor layer and having a substantially flat upper face thereof, said lower and upper semiconductor layers forming a diode; and an active region between said layers generating light a substantial proportion of which propagates parallel to said active region guided by internal reflections at said upper and lower faces, said structure having outer side faces surrounding the structure;

a conductor layer in electrical contact with substantially all of the top of said upper semiconductor layer;

at least one metal conductor electrically in contact with an underlying portion of said lower semiconductor layer;

means harvesting upward and downward vertical light from said active region; and wherein said semiconductor structure is arranged to have several light-extraction surfaces distributed about the semiconductor structure for release of said guided light from the semiconductor structure, said light-extraction surfaces being distant from said outer side faces, interfacing with a translucent non-semiconductor medium, meeting at least one of said upper and lower faces and inclined to said upper face.

39. An LED lamp according to claim 38 wherein said lightextraction surfaces each cut into both of said lower and upper semiconductor layers.

40. An LED lamp according to claim 38 wherein said conductor layer is of metal.

41. An LED lamp according to claim 40 wherein said conductor layer of metal is light-passing.

42. An LED lamp according to claim 38 including a layer of material translucent to visible light and of lower refractive index than said lower semiconductor layer under the lower semiconductor layer, and including a semiconductor substrate of higher refractive index than said layer of translucent material below the layer of translucent material.

43. An LED lamp according to claim 38 wherein said lightextraction surfaces are oblique to said upper face.

44. An LED lamp according to claim 38 including a nonsemiconductor substrate that is translucent to visible light and over which said semiconductor structure is grown.

45. An LED lamp according to any of claims 1, 16, 19, 27, 29 or 38 including a sapphire substrate on which said semiconductor structure is grown.

46. An LED lamp for generating incoherent visible light, comprising:
   an inorganic semiconductor structure comprising: a lower semiconductor layer having a lower face thereof; an upper semiconductor layer grown over said lower semiconductor layer and having an upper face thereof, said lower and upper semiconductor layers forming a diode; and an active region between said layers generating light a substantial proportion of which propagates parallel to said active region guided by internal reflections at said upper and lower faces, said structure having outer side faces surrounding the structure;
   a conductor layer in electrical contact with substantially all of the top of said upper semiconductor layer;
   at least one metal conductor electrically in contact with an underlying portion of said lower semiconductor layer;
   means harvesting vertical light from said active region; and
   wherein said semiconductor structure has a plurality of cavities distributed about the structure for release of the guided light; each of the cavities extending down from said upper face, terminating at a floor that is below said active region, and containing a non-semiconductor medium; side walls of the cavities diverting said guided light.

47. An LED lamp according to claim 46 wherein said side walls are oblique to said lower face, whereby release of guided light is enhanced.

48. An LED lamp according to claim 46 wherein said side walls are sides of separate LEDs that are driven together.

49. An LED lamp according to claim 46 wherein said lower semiconductor layer comprises a sub-layer of low resistivity.

50. An LED lamp according to claim 46 wherein said side walls pass light.

51. An LED lamp according to claim 46 including: a first conductor on said semiconductor structure; a second conductor on said semiconductor structure crossing over said first conductor; and insulation preventing electrical contact between the first and second conductors.

52. An LED lamp according to claim 46 wherein each of said cavities contains a metal floor-conductor on the cavity floor, each floor-conductor feeding current to portions of said semiconductor structure that are on opposite sides of the floor conductor and the floor-conductors in the cavities feeding current to said lower semiconductor layer together when the lamp is turned on.

53. An LED lamp according to claim 46 wherein said semiconductor structure includes a plurality of LEDs the tops of which are electrically joined together by an opaque conductor.

54. An LED lamp for generating incoherent visible light, comprising:
   an inorganic semiconductor structure comprising: a lower semiconductor layer having a lower face thereof; an upper semiconductor layer having an upper face thereof, said lower and upper semiconductor layers forming a diode; and an active region between said layers generating light; said structure having an outer side faces surrounding the structure;
   means harvesting vertical light from said active region;
   at least one conductor in electrical contact with said lower semiconductor layer;
   a conductor layer covering and in electrical contact with said upper semiconductor layer;
   thin light-passing dielectric material covering said conductor layer;
   an opaque reflector covering said light-passing dielectric material; and
   wherein said semiconductor structure is formed to have light-diverting surfaces distributed about the structure for release of light from the semiconductor structure, each distant from said side faces, inclined to said semiconductor layers, and meeting at least one of said upper and lower faces.

55. An LED lamp according to claim 54 wherein said upper semiconductor layer is grown over said lower semiconductor layer.

56. An LED lamp according to claim 54 provided with several spaced-apart metal parts above said upper semiconductor layer for cooling said active region.

57. An LED lamp for generating incoherent visible light, comprising:
   an inorganic semiconductor structure comprising: a lower semiconductor layer having a lower face thereof and an upper semiconductor layer having an upper face thereof, said lower and upper semiconductor layers forming a diode; and an active region between said layers generating light;
   distributed opaque conductors each in electrical contact with said lower semiconductor layer and each positioned between light generating parts of said structure as viewed normal to said active region;
   reflector means at said upper face reflective to light from said active region incident thereon at 45 degrees; and
   wherein said semiconductor structure has several light-generating portions at least partly separated from each other by light-diverting surfaces that extend from said upper face into the lower semiconductor layer, at least one of the light-diverting surfaces being at an obtuse angle to said upper face measured through semiconductor, and each of said light-diverting surfaces deflecting light that has been generated by an associated portion of said active region and reflected by said reflector means, the deflected light striking said lower face on its way to contributing to light output from the lamp;
   wherein each of the LED portions has a conductor part thereon for energizing the upper semiconductor layer,
   wherein upward and downward light generated in said portions are harvested; and wherein interconnection is provided for causing currents to flow through said conductor parts and said opaque conductors together when the lamp is turned on.

58. An LED lamp according to claim 57 wherein said light-diverting surfaces are side walls of trenches.

59. An LED lamp according to claim 58 including a conductor on said semiconductor structure that is electrically connected to said upper semiconductor layer and that crosses at least one of said trenches.

60. An LED lamp according to claim 59 wherein the crossed trench contains a conductor track electrically connected to said lower semiconductor layer.

61. An LED lamp according to claim 57 including metallic reflectors at said light-diverting surfaces.

62. An LED lamp according to claim 57 including a heat sink above said semiconductor structure for cooling said active region.

63. An LED lamp according to claim 57 including a conductor layer covering and in electrical contact with said upper semiconductor layer.

64. An LED lamp according to claim 57 wherein a pair of said light diverting surfaces are separated by a space devoid of semiconductor.

65. An LED lamp according to claim 57 wherein said opaque conductors are parts of a grid.

66. An LED lamp according to claim 57 wherein said semiconductor structure has a refractive index of at least 3.

67. An LED lamp according to claim 57 wherein said upper semiconductor layer is formed over said lower semiconductor layer.

68. An LED lamp according to claim 57 wherein said obtuse angle is more than 110 degrees.

69. An LED lamp according to claim 57 including an opaque reflector above said upper semiconductor layer for reflecting back into that layer upward light from said active region.

70. An LED lamp according to claim 57 wherein said conductor layer is light-passing.

71. An LED lamp for generating incoherent visible light, comprising:
  an inorganic semiconductor structure comprising a lower semiconductor layer having a lower face thereof and an upper semiconductor layer having an upper face thereof, said lower and upper semiconductor layers forming a diode and an active region between said layers generating light, said structure having outer side faces surrounding the structure and a plane generally parallel to said lower face defining a reference plane;
  means harvesting upward and downward vertical light from said active region;
  at least one metal conductor on said semiconductor structure electrically connected with said upper semiconductor layer;
  a plurality of spaced-apart conductors on said semiconductor structure each for energizing an associated underlying portion of said lower semiconductor layer and each being distant from said outer side faces and positioned between light generating portions of said semiconductor structure as viewed normal to said reference plane; said semiconductor structure being arranged to have several light-extraction surfaces distributed about the semiconductor structure for enhancing release of light from the semiconductor structure, the light-extraction surfaces being distant from said outer side faces and inclined to said reference plane; and
  electrical connection for causing said spaced-apart conductors to pass current to said lower semiconductor layer together when the lamp is turned on.

72. An LED lamp according to claim 71 wherein said upper semiconductor layer is p-type and is covered and in electrical contact with a conductor layer.

73. An LED lamp according to claim 72 wherein said semiconductor structure comprises light-generating portions (E, TE) that are at least partly delineated by conductor tracks that energize said lower semiconductor layer.

74. An LED lamp according to claim 72 wherein each of said light-extraction surfaces is in contact with a non-semiconductor medium.

75. An LED lamp according to claim 72 wherein said light-extraction surfaces are side walls of cavities in the semiconductor structure containing material having a refractive index less than 1.4, and wherein the side walls are inclined to said upper face by an obtuse angle as measured through semiconductor.

76. An LED lamp according to claim 72 including a member serving at least as a heat sink for the semiconductor structure, said member being above the semiconductor structure.

77. An LED lamp according to claim 72 including several spaced metallic parts passing heat from said semiconductor structure to said member.

78. An LED lamp according to claim 72 wherein a plane normal to said layers cuts at least four of said light-extraction surfaces.

79. An LED lamp according to claim 71 wherein said light-diverting surfaces are in contact with a medium having a refractive index less than 1.4.

80. An LED lamp according to claim 71 wherein said light-diverting surfaces are side walls of trenches.

81. An LED lamp according to claim 80 wherein said trenches contain metallic reflectors.

82. An LED lamp for generating incoherent visible light, comprising:
  an inorganic semiconductor structure comprising a lower semiconductor layer having a lower face thereof and an upper semiconductor layer having an upper face thereof, said lower and upper semiconductor layers forming a diode and an active region between said layers generating light, said structure having outer side faces surrounding the structure and a plane generally parallel to said lower face defining a reference plane;
  means harvesting upward and downward vertical light from said active region;
  a conductor layer covering and in electrical contact with said upper semiconductor layer;
  a plurality of trenches in said semiconductor structure each extending from said upper face into said semiconductor structure and each containing a metal track at least part of which is in electrical contact with said lower semiconductor layer; said semiconductor structure having several light-extraction surfaces distributed about the semiconductor structure for enhancing release of light from the semiconductor structure, said light-extraction surfaces being distant from said outer side faces and inclined to said reference plane, LED light propagating in the semiconductor structure being diverted at said light-extraction surfaces; and
  electrical connection for causing said tracks to pass current together when the lamp is turned on.

83. An LED lamp according to 82 including reflectors in said trenches that are oblique to said reference plane.

84. An LED lamp according to claim 1 wherein said cavities are trenches.

85. An LED lamp according to claim 1 including trenches in said semiconductor inclined one to another.

86. An LED lamp according to claim 19 wherein said spaced-apart conductor parts are above said lower face.

87. An LED lamp according to claim 38 including first and second trenches in said semiconductor structure that are inclined one to the other, at least one of trenches containing a metallic part that is in electrical contact with said lower semiconductor layer.

88. An LED lamp according to claim 38 including a trench in said semiconductor structure cutting through the active region from said upper face, and including a conductor that is in electrical contact with said upper semiconductor layer and that crosses the trench.

89. An LED lamp according to claim 46 wherein each of said side walls diverts a beam of light as a beam.

90. An LED lamp according to claim 46 wherein said cavities contain metallic reflectors that deflect light generated by said active region.

91. An LED lamp according to any of claims 1, 31, 32 or 57 wherein said semiconductor structure has a refractive index of at least 3.

92. An LED lamp according to any of any of claims 1, 19, 57 or 82 or including a substrate that is electrically non-conducting and over which at least one of said semiconductor layers has been grown.

93. An LED lamp according to any of claims 46, 54, 57, 71, or 82 including a sapphire substrate over which at least one of said semiconductor layers has been grown.

94. An LED lamp according to any of claims 1, 19, 38, 71 or 82 wherein each of said light-extraction surfaces diverts a beam of light as a beam.

95. An LED lamp according to claim 54 or 57 wherein each of said light-diverting surfaces diverts a beam of light as a beam.

96. An LED lamp according to any of claims 1, 16, 19, 23, 27, 29, 31, 32, 35, 38, 46, 54, 57, 71, or 82 wherein said semiconductor structure comprises a layer that is a nitride of at least gallium.

97. An LED lamp according to any of claims 1, 16, 19, 23, 27, 29, 31, 32, 35, 54, 57, 71, or 82 wherein said semiconductor structure is at least part of a chip.

98. An LED lamp according to any of any of claims 1, 19, 38, 71, or 82 wherein each of said surfaces distant from said outer side faces is of a predetermined area and is placed at an associated predetermined position of said semiconductor structure.

99. An LED lamp according to any of claims 1, 19, 23, 27, 57, 71, or 82 including a substrate having top face over which said semiconductor structure is grown and wherein light generation in said semiconductor structure extends over an area substantially the same as that of said substrate top face.

100. An LED lamp according to any of claims 1, 19, 57 or 82 including at least one trench that extends from said upper face through said active region and that is crossed by a conductor that electrically contacts said upper semiconductor layer.

* * * * *